US012772374B2

(12) United States Patent
Li

(10) Patent No.: US 12,772,374 B2
(45) Date of Patent: Oct. 20, 2026

(54) CIRCUIT BOARD HAVING A SWITCH AND METHOD FOR FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventor: Cheng-Jia Li, Shenzhen (CN)

(73) Assignees: HONGQISHENG PRECISION ELECTRONICS (QINHUANGDAO) CO., LTD., Hebei Province (CN); AVARY HOLDING (SHENZHEN) CO., LTD., Shenzhen (CN); GARUDA TECHNOLOGY CO., LTD., New Taipei City (TW)

( * ) Notice: Subject to any disclaimer, the term of this patent is extended or adjusted under 35 U.S.C. 154(b) by 185 days.

(21) Appl. No.: 18/929,000

(22) Filed: Oct. 28, 2024

(65) Prior Publication Data

US 2026/0122774 A1 Apr. 30, 2026

(51) Int. Cl.

*H05K 1/18* (2026.01)
*H05K 1/02* (2006.01)

(Continued)

(52) U.S. Cl.

CPC ........... *H05K 1/0272* (2013.01); *H05K 1/185* (2013.01); *H05K 3/22* (2013.01); *H05K 3/4644* (2013.01);

(Continued)

(58) Field of Classification Search

CPC ........ H05K 1/0272; H05K 1/185; H05K 3/22; H05K 3/4644; H05K 2201/09036; H05K 2201/10053

(Continued)

(56) References Cited

U.S. PATENT DOCUMENTS

| | | | | |
|---|---|---|---|---|
| 5,841,638 A * | 11/1998 | Purdom | H05K 1/144 | 439/91 |
| 2017/0009959 A1 * | 1/2017 | Shida | F21V 11/00 | |

(Continued)

FOREIGN PATENT DOCUMENTS

| | | |
|---|---|---|
| CN | 202307642 U | 7/2012 |
| CN | 216981888 U | 7/2022 |

*Primary Examiner* — Binh B Tran

(74) *Attorney, Agent, or Firm* — MUNCY, GEISSLER, OLDS & LOWE, P.C.

(57) ABSTRACT

A circuit board having a switch includes an insulation material layer, first and second insulation layers, a circular channel, a first cover layer, an inert liquid material, a first conductive block, a second conductive block and a conductive layer. The first and second insulation layers are respectively on bottom and top surfaces of the insulation material layer. The circular channel is in the first and second insulation layers and the insulation material layer, and includes a first sub-channel, a second sub-channel, a first connection channel and a second connection channel. The first cover layer is on a bottom surface of the first insulation layer. The inert liquid material is in the circular channel. The first conductive block is in the first sub-channel. The second conductive block is in the second sub-channel. The conductive layer is in the insulation material layer and adjacent to the circular channel.

15 Claims, 10 Drawing Sheets

(51) Int. Cl.
*H05K 1/185* (2026.01)
*H05K 3/22* (2006.01)
*H05K 3/46* (2006.01)

(52) U.S. Cl.
CPC .............. *H05K 2201/09036* (2013.01); *H05K 2201/10053* (2013.01)

(58) Field of Classification Search
USPC .......................................................... 361/781
See application file for complete search history.

(56) References Cited

U.S. PATENT DOCUMENTS

| | | | | |
|---|---|---|---|---|
| 2021/0315122 | A1 | 10/2021 | Sorel et al. | |
| 2022/0140714 | A1* | 5/2022 | Mawatari | H02K 15/02 310/264 |

* cited by examiner

CIRCUIT BOARD HAVING A SWITCH AND METHOD FOR FABRICATING THE SAME

BACKGROUND

Field of Invention

The present invention relates to a circuit board having a switch.

Description of Related Art

With the rapid development of electronic products, printed circuit boards (PCBs), which are used as a device for supporting components and transmission of electrical signals, gradually progress towards high density and multi-functionality. Vias are an important part of the design and manufacture of printed circuit boards, which transmit signals to different layers of the board. The vias are usually electrically connected to two networks by an electroplating method. However, in practical applications there is a need for switching between disconnecting and connecting networks.

SUMMARY

According to some embodiments of the present disclosure, a circuit board having a switch is provided. The switch may make a conductive block levitate in an inert liquid material by a density difference between the inert liquid material and the conductive block, so that the switch may control the circuit to turn on or turn off by utilizing changes of the positions or the gravitational directions of the object. By using the principle of the gravity rather than an electrical signal or a mechanical contact, operational mistakes caused by an abrasion, an electromagnetic interference and so on can be reduced. Since the switch generally works without electricity, it is beneficial to extend the working time of the apparatuses and the life time of the batteries. Furthermore, the switch may be applied to different environmental conditions. Whether in a high temperature, a low temperature or in other environments, the switch may maintain a stable working performance, increasing its application possibilities in extreme conditions. In summary, the switch may trigger a switch action according to changes of a tilting angle or a position of the devices, so that the switch may provide advantages of flexibility, reliability, ease of use, wide range of applications, low power consumption, and adaptability. Thus, the switch may be applied in different devices.

According to some embodiments of the present disclosure, a circuit board having a switch is provided. The circuit board includes an insulation material layer, a first insulation layer, a second insulation layer, a circular channel, a first cover layer, an inert liquid material, a first conductive block, a second conductive block and a conductive layer. The first insulation layer is on a bottom surface of the insulation material layer. The second insulation layer is on a top surface of the insulation material layer. The circular channel is in the first insulation layer, the insulation material layer and the second insulation layer. The circular channel includes a first sub-channel, a second sub-channel, a first connection channel and a second connection channel. The first sub-channel extends from the first insulation layer toward the second insulation layer. The second sub-channel is adjacent to the first sub-channel and extends from the first insulation layer toward the second insulation layer. The first connection channel is fluidly connected a bottom end of the first sub-channel to a bottom end of the second sub-channel. The second connection channel is fluidly connected a top end of the first sub-channel to a top end of the second sub-channel. The first cover layer is on a bottom surface of the first insulation layer and configured to seal an opening of the first insulation layer. The inert liquid material is in the circular channel. The first conductive block is in the first sub-channel, in which a density of the inert liquid material is greater than a density of the first conductive block. The second conductive block is in the second sub-channel, in which a density of the inert liquid material is greater than a density of the second conductive block. The conductive layer is in the insulation material layer and adjacent to the circular channel.

According to some embodiments of the present disclosure, in which the first connection channel is fluidly connected to the opening of the first insulation layer.

According to some embodiments of the present disclosure, the circuit board further includes a second cover layer. The second cover layer is on a top surface of the second insulation layer.

According to some embodiments of the present disclosure, in which the first conductive block is in direct contact with the insulation material layer and the inert liquid material.

According to some embodiments of the present disclosure, in which the first conductive block has a conductive block opening, and the conductive block opening extends from a top surface of the first conductive block to a bottom surface of the first conductive block.

According to some embodiments of the present disclosure, in which the first conductive block has a same width as a width of the first sub-channel of the circular channel.

According to some embodiments of the present disclosure, in which the density of the inert liquid material is between 4.3 g/cm$^3$ and 2.75 g/cm$^3$.

According to some embodiments of the present disclosure, in which the density of the first conductive block is between 2 g/cm$^3$ and 2.3 g/cm$^3$.

According to some embodiments of the present disclosure, a method for fabricating a circuit board having a switch is provided. The method includes following steps: forming a first structure, including: forming a circular channel in a first insulation layer and an insulation material layer, in which the first insulation layer is on a top surface of the insulation material layer; disposing a conductive layer in the insulation material layer and adjacent to the circular channel; and disposing a conductive block in the circular channel, in which the conductive block has a conductive block opening, and the conductive block opening extends from a top surface of the conductive block to a bottom surface of the conductive block; forming a second structure, in which the second structure has a second insulation layer; bonding the first structure and the second structure to seal the circular channel; forming a first opening in the second insulation layer; injecting an inert liquid material into the circular channel through the first opening, in which a density of the inert liquid material is greater than a density of the conductive block; and forming a cover layer on a bottom surface of the second insulation layer to seal the first opening of the second insulation layer.

According to some embodiments of the present disclosure, in which forming the first structure further includes: forming a sacrificial layer in the circular channel before or after disposing the conductive block, and the method further includes: removing the sacrificial layer from the circular channel before injecting the inert liquid material and after forming the first opening.

According to some embodiments of the present disclosure, in which forming the circular channel is performed such that the circular channel comprises a first sub-channel and a second sub-channel, and the first and second sub-channels extend in the same direction.

According to some embodiments of the present disclosure, in which a width of the second sub-channel is the same as a width of the first sub-channel.

According to some embodiments of the present disclosure, in which forming the circular channel is performed such that the circular channel further includes a first connection channel and a second connection channel, in which the first connection channel fluidly connects a bottom end of the first sub-channel to a bottom end of the second sub-channel, and the second connection channel fluidly connects a top end of the first sub-channel to a top end of the second sub-channel.

According to some embodiments of the present disclosure, in which a length of the first opening is less than a length of the first connection channel.

According to some embodiments of the present disclosure, in which a width of the second connection channel is less than a width of the first connection channel.

DETAILED DESCRIPTION

The embodiments of the present disclosure are discussed in detail below. However, it should be understood that the embodiments provide many applicable concepts that can be implemented in a wide variety of specific contexts. The embodiments discussed and disclosed are for illustrative purposes only and are not intended to limit the scope of the present disclosure. As used herein, the terms ‘first’, ‘second’, etc., do not specifically refer to order or sequence, but are intended only to distinguish components or operations that are described in the same technical terms.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, “around,” “about,” “approximately,” or “substantially” shall generally mean within 20 percent, or within 10 percent, or within 5 percent of a given value or range. Numerical quantities given herein are approximate, meaning that the term “around,” “about,” “approximately,” or “substantially” can be inferred if not expressly stated.

Figure 1A:
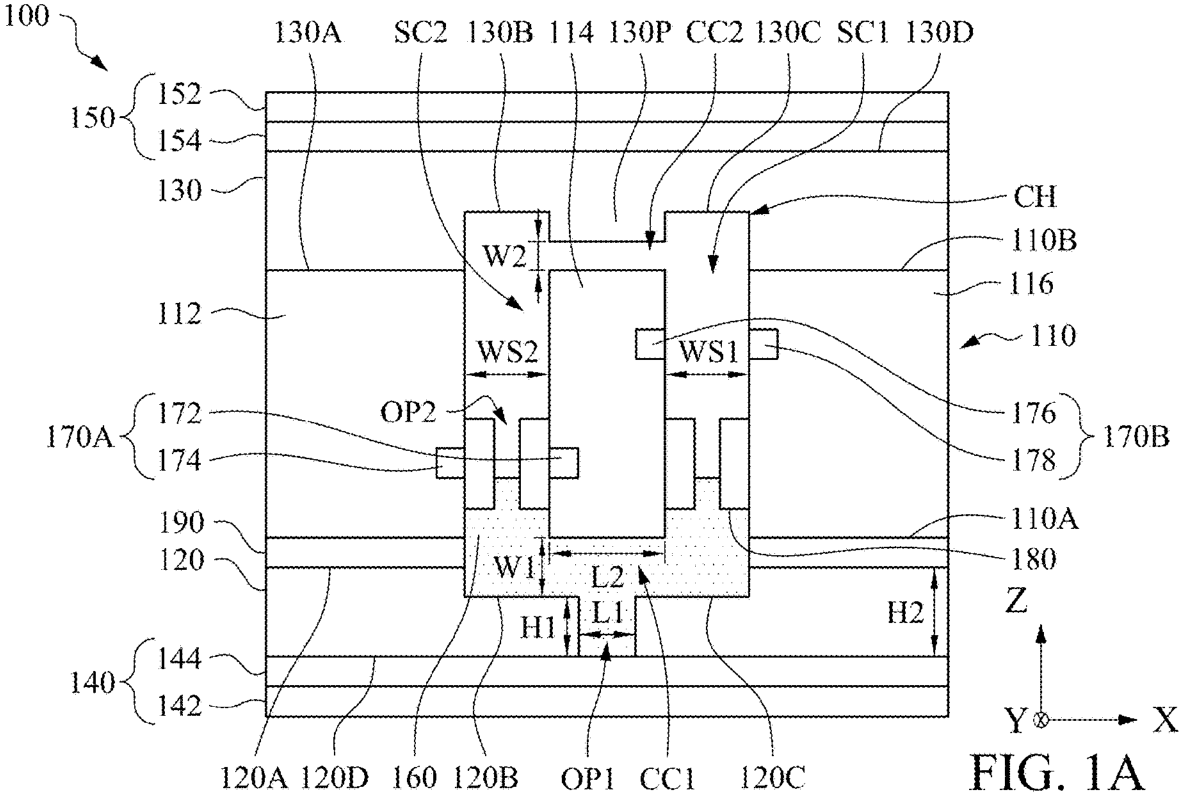
FIG. 1A is a schematic diagram of a circuit board having a switch when the circuit board is placed right-side up in accordance with some embodiments of the present disclosure.
Figure 1B:
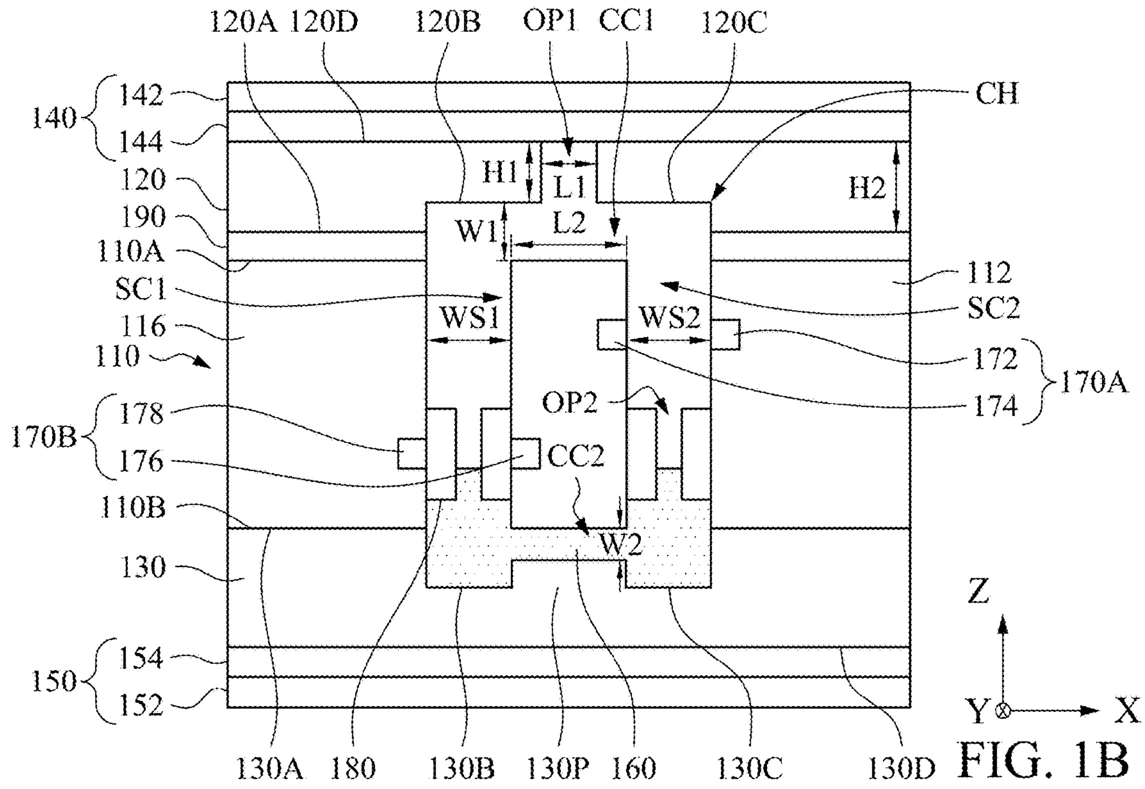
FIG. 1B is a schematic diagram of a circuit board having a switch when the circuit board is placed right-side down in accordance with some embodiments of the present disclosure.

FIG. 1A is a schematic diagram of a circuit board 100 having a switch when the circuit board 100 is placed right-side up in accordance with some embodiments of the present disclosure. FIG. 1B is a schematic diagram of a circuit board 100 having a switch when the circuit board 100 is placed right-side down in accordance with some embodiments of the present disclosure. Please refer to FIGS. 1A and 1B. The circuit board 100 having a switch in the FIG. 1A may be turned upside down by 180 degrees to be the circuit board 100 having a switch in the FIG. 1B by a manual method or a mechanical method, thus achieving different switch functions. For example, in the circuit board 100 having a switch of the FIG. 1A, a conductive block 180 is in contact with contact points 172 and 174 of a conductive layer 170A, so that the contact points 172 and 174 are electrically connected with each other, and contact points 176 and 178 of a conductive layer 170B are disconnected from each other. The conductive block 180 is in contact with contact points 176 and 178 of the conductive layer 170B in the circuit board 100 of the FIG. 1B, so that the contact points 176 and 178 are electrically conductive with each other, and contact points 172 and 174 of a conductive layer 170B are disconnected from each other.

In some embodiments, the circuit board 100 includes an insulation material layer 110, insulation layers 120 and 130, cover layers 140 and 150, an inert liquid material 160, conductive layers 170A and 170B, a conductive block 180 and an adhesion layer 190.

In some embodiments, the insulation material layer 110, insulation layers 120 and 130 may be formed by organic or inorganic insulation materials. For example, in some embodiments, the insulation material layer 110, insulation layers 120 and 130 may be formed by a polyimide (PI) or an ink. In addition, the insulation material layer 110 may be served as photosensitive insulation layer to reduce the complexity of the process. For example, in the present embodiment, the insulation material layer 110 may be formed by a photosensitive polyimide (PSPI) and so on. Configurations of the insulation material layer 110, insulation layers 120 and 130 may be adjusted according to functional requirements. For example, in the present embodiment, the insulation layer 120 is on a surface 110A of the insulation material layer 110. The insulation layer 130 is on a surface 110B of the insulation material layer 110, in which the insulation material layer 110, insulation layers 120 and 130 jointly have a circular channel CH.

In some embodiments, the circular channel CH includes a sub-channel SC1, a sub-channel SC2, a connection channel CC1 and a connection channel CC2. In some embodiments, the sub-channels SC1 and SC2 may extend along the same direction. For example, in the present embodiment, the sub-channels SC1 and SC2 may extend from the insulation layer 120 to the insulation layer 130. Configurations of the sub-channels SC1 and SC2 may be adjusted according to functional requirements. For example, in the present embodiment, the sub-channel SC1 separates a portion 112 of the insulation material layer 110 from a portion 114 of the insulation material layer 110. The sub-channel SC1 causes the insulation layers 120 and 130 to form a recess, so that a surface 120B of the insulation layer 120 is lower than a surface 120A of the insulation layer 120, and a surface 130B of the insulation layer 130 is higher than a surface 130A of the insulation layer 130. The sub-channel SC2 separates a portion 114 of the insulation material layer 110 from a portion 116 of the insulation material layer 110. The sub-channel SC2 causes the insulation layers 120 and 130 to form a recess, so that a surface 120C of the insulation layer 120 is lower than the surface 120A of the insulation layer 120, and a surface 130C of the insulation layer 130 is higher than a surface 130A of the insulation layer 130. In some embodiments, the surfaces 120C and 120B are substantially aligned with each other, and the surfaces 130C and 130B are substantially aligned with each other, so that the sub-channels SC1 and SC2 may have the same height.

In some embodiments, the sub-channel SC1 is fluidly connected to the sub-channel SC2. For example, in the present embodiment, the insulation material layer 110 and the insulation layer 120 jointly have the connection channel CC1. The connection channel CC1 connects a bottom end of the sub-channel SC1 to a bottom end of the sub-channel SC2. The insulation material layer 110 and the insulation layer 130 jointly have the connection channel CC2. The connection channel CC2 connects a top end of the sub-channel SC1 to a top end of the sub-channel SC2. In some embodiments, the insulation layer 130 has a protruding portion 130P, so that a width W2 of the connection channel CC2 is less than a width W1 of the connection channel CC1.

In addition, the connection channel CC1 is fluidly connected to an opening OP1 of the insulation layer 120. The opening OP1 extends from the surfaces 120B and 120C of the insulation layer 120 to the surface 120D, in which a height H1 of the opening OP1 is less than a height H2 of the insulation layer 120, and a length L1 of the opening OP1 is less than a length L2 of connection channel CC2.

In some embodiments, the cover layer 140 includes a material layer 142 and an adhesion layer 144, in which the material layer 142 is disposed on the adhesion layer 144. The material layer 142 may adopt similar materials to the insulation layer 120. For example, in the present embodiment, the material layer 142 may be a polyimide (PI) or similar materials. The adhesion layer 144 may adopt high temperature resistant materials. For example, in the present embodiment, the adhesion layer 144 may be an epoxy. Thus, the opening OP1 of the insulation layer 120 may be sealed by disposing the cover layer 140 on the surface 120D of the insulation layer 120, so that the circular channel CH may serve as a closed channel. The cover layer 150 is on the surface 130D of the insulation layer 130, and includes a material layer 152 and an adhesion layer 154, in which the material layer 152 and adhesion layer 154 are similar to the material layer 142 and the adhesion layer 144.

In some embodiments, the inert liquid material 160 are also known as a density gradient or a separation solution. The inert liquid material 160 may effectively separate objects according to density differences of the objects. The inert liquid material 160 may be organic compounds, solutions of inorganic salts, solutions of heavy metal salts, the like or combinations thereof, and the density of the inert liquid material 160 may be adjusted according to functional requirements to perform different separation requests. For example, in some embodiments, the inert liquid material 160 may be materials with a density between 4.3 g/cm$^3$ and 2.75 g/cm$^3$ such as a carbon tetrachloride ($CCl_4$), a mixture of a barium chloride ($BaCl_2$) and water, a solution of a potassium thiocyanate (KSCN) and water, a clerici solution, a 85% thallic formate ($Tl(CHO_2)$), a silicon tetrabromide ($SnBr_4$), a diiodomethane ($CH_2I_2$), a Thoulet's solution (i.e., an aqueous solution mixed with mercuric iodide ($HgI_2$) and a potassium iodide (KI)), a tetrabromoethane ($C_2H_2Br_4$), a bromoform ($CHBr_3$), a tribromofluoromethane ($CBrF_3$), a bromoethane ($C_2H_5Br$), a 78% zinc bromide ($ZnBr_2$), a dibromomethane ($CH_2Br_2$), the like or combinations thereof. In the present embodiment, the inert liquid material 160 may be a $CHBr_3$, $CH_2I_2$, a clerici solution, the like, or combinations thereof, in which the densities, in ascending order, are $CHBr_3$, $CH_2I_2$ and, the clerici solution.

In some embodiments, the inert liquid material 160 may be located in the circular channel CH, and randomly flows inside the circular channel CH. For example, in the present embodiment, when the circuit board 100 having a switch is placed right-side up (as shown in FIG. 1A), the inert liquid material 160 may be at the bottom end of the sub-channel SC1 (i.e., on the surface 120C of the insulation layer 120) and the bottom end of the sub-channel SC2 (i.e., on the surface 120B of the insulation layer 120) through the connection channel CC1, and the inert liquid material 160 fills the opening OP1. When the circuit board 100 having the switch is placed right-side down (as shown in FIG. 1B), the inert liquid material 160 may be at the top end of the sub-channel SC1 (i.e., on the surface 130B of the insulation layer 130) and the top end of the sub-channel SC2 (i.e., on the surface 130C of the insulation layer 130) through the connection channel CC2, and the inert liquid material 160 cover the protruding portion 130P.

In some embodiments, the conductive layers 170A and 170B are in the insulation material layer 110. The conductive layers 170A and 170B may be electroconductive pastes, and may adopt a copper paste, a solder paste, a silver paste, the like or combinations thereof. However, conductive layers 170A and 170B may adopt any appropriate materials without such limitations. Configurations of the conductive layers 170A and 170B may be adjusted according to functional requirements. For example, in the present embodiments, the conductive layer 170A includes the contact points 172 and 174, in which the contact points 172 and 174 are separated from each other. The conductive layer 170B includes the contact points 176 and 178, in which the contact points 176 and 178 are separated from each other. The contact points 172, 174, 176 and 178 may be adjacent to and exposed by the circular channel CH. In detail, the contact point 172 is located at the portion 112 of the insulation material layer 110. The contact point 174 is located at the portion 114 of the insulation material layer 110, in which the sub-channel SC2 of the circular channel CH separates the contact point 172 from the contact point 174. The contact point 176 is located at the portion 114 of the insulation material layer 110, in which the portion 114 of the insulation material layer 110 separates the contact point 176 from the contact point 174. The contact point 178 is located at the portion 116 of the insulation material layer 110, in which the sub-channel SC1 of the circular channel CH separates the contact point 176 from the contact point 178.

In some embodiments, the conductive block 180 may be conductive materials with a density less than that of the inert liquid material 160. For example, in some embodiments, the conductive block 180 may be materials with a density between 2 g/cm$^3$ and 2.3 g/cm$^3$. In the present embodiment, the conductive block 180 may be a graphene. The conductive block 180 may be in the circular channel CH, and be in direct contact with the insulation material layer 110 and the inert liquid material 160, in which the conductive block 180 may be levitated on the inert liquid material 160 because of a density difference.

Figure 2A:
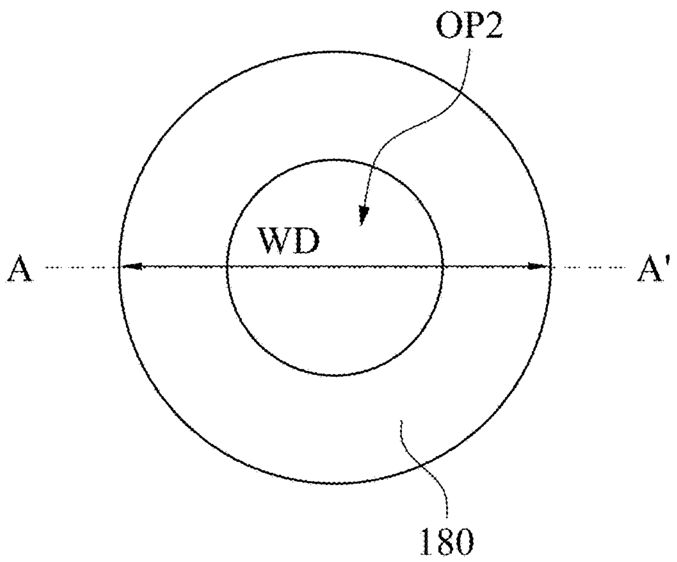
FIG. 2A is a top view of a conductive block of a switch of a circuit board in accordance with some embodiments of the present disclosure.
Figure 2B:
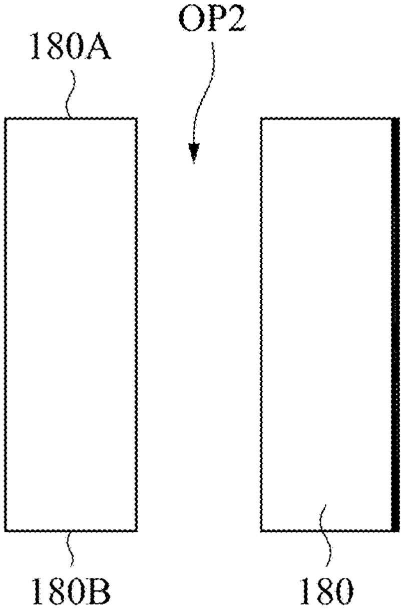
FIG. 2B is a cross-sectional view of FIG. 2A taken along the line A-A'.

FIG. 2A is a top view of a conductive block 180 of a switch of a circuit board 100 in accordance with some embodiments of the present disclosure. FIG. 2B is a cross-sectional view of FIG. 2A taken along the line A-A'. The conductive block 180 may have an opening OP2 to form a hollow structure, in which the opening OP2 extends from a surface 180A of the conductive block 180 to a surface 180B of the conductive block 180. A diameter width WD of the conductive block 180 is the same as a width WS1 of the sub-channel SC1 of the circular channel CH (referring to FIGS. 1A and 1B) and a width WS2 of the sub-channel SC2 of the circular channel CH (referring to FIGS. 1A and 1B).

Therefore, the positions of the inert liquid material 160 in the circuit board 100 having the switch may be changed by the gravity, so that the conductive block 180 is connected to different circuits, thus achieving electrical connection or disconnection of different circuits. For example, in the present embodiment, when the circuit board 100 is placed right-side up, the conductive block 180 located in the sub-channel SC2 may be in contact with the contact points 172 and 174, thereby turning on the circuits connected by the contact points 172 and 174. Meanwhile, the conductive block 180 located in the sub-channel SC1 may be below the contact points 176 and 178, thereby turning off the circuits connected by the contact points 176 and 178. When the circuit board 100 is placed right-side down, the inert liquid material 160 may flow through the opening OP2, and the conductive block 180 located in the sub-channel SC1 may be in contact with the contact points 176 and 178, thereby turning on the circuits connected by the contact points 176 and 178, in which part of the inert liquid material 160 may be in the opening OP2 of the conductive block 180. Meanwhile, the conductive block 180 located in the sub-channel SC2 may be below the contact points 172 and 174, thereby turning off the circuits connected by the contact points 172 and 174.

In another embodiment, when the circuit board 100 having the switch is placed right side up and tilted at a certain angle (for example, an angle of 45 degrees with respect to a plane of directions X and Y), the conductive block 180 located at the sub-channel SC2 may be not in contact with the contact points 172 and 174 (i.e., the conductive block 180 located in the sub-channel SC2 may be above the contact points 172 and 174), thus turning off the circuits connected by the contact points 172 and 174. Meanwhile, the conductive block 180 located in the sub-channel SC1 may be below the contact points 176 and 178, thus turning off the circuits connected by the contact points 176 and 178. Therefore, it may be achieved that the circuits connected by the contact points 172 and 174 and the circuits connected by the contact points 176 and 178 are all turned off.

In another embodiment, when the circuit board 100 having the switch is placed right side down and tilted at a certain angle (for example, an angle of 45 degrees with respect to a plane of directions X and Y), the conductive block 180 located in the sub-channel SC1 may be not in contact with the contact points 176 and 178 (i.e., the conductive block 180 located in the sub-channel SC1 may be above the contact points 176 and 178), thus turning off the circuits connected by the contact points 176 and 178. Meanwhile, the conductive block 180 located in the sub-channel SC2 may be below the contact points 172 and 174, thereby turning off the circuits connected by the contact points 172 and 174. Therefore, it may be achieved that the circuits connected by the contact points 172 and 174 and the circuits connected by the contact points 176 and 178 are all turned off.

Furthermore, heights of the contact points 172, 174, 176 and 178 may be designed according to volume of the inert liquid material 160 and capacities of the circular channel CH. For example, in some embodiments, when a volume of the inert liquid material 160 in the circular channel CH is smaller, the heights between the contact points 172, 174, 176 or 178 and the surface 110B of the insulation material layer 110 are accordingly reduced to ensure that the conductive block 180 is connected to the contact points 172, 174, 176 or 178.

In some embodiments, the circuit board 100 further includes the adhesion layer 190. The adhesion layer 190 may adopt high temperature resistant materials. For example, in the present embodiment, the adhesion layer 190 may be an epoxy. A configuration of the adhesion layer 190 may be adjusted according to functional requirements. For example, the adhesion layer 190 is between the portion 116 of the insulation material layer 110 and the insulation layer 120, and is between the portion 112 of the insulation material layer 110 and the insulation layer 120.

Figure 3A:
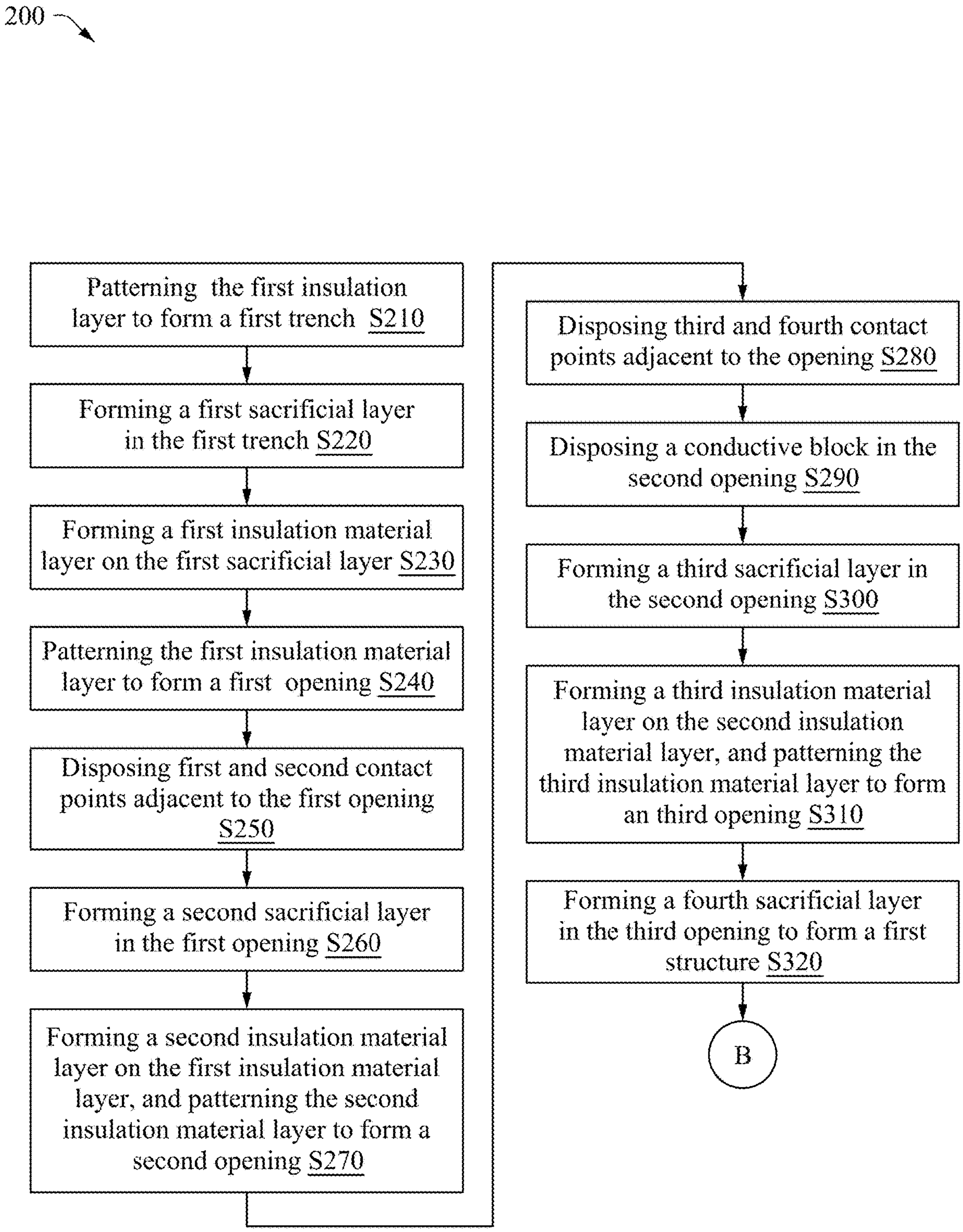
FIGS. 3A and 3B are a flow chart of a method for fabricating a circuit board having a switch in accordance with some embodiments of the present disclosure.
Figure 3B:
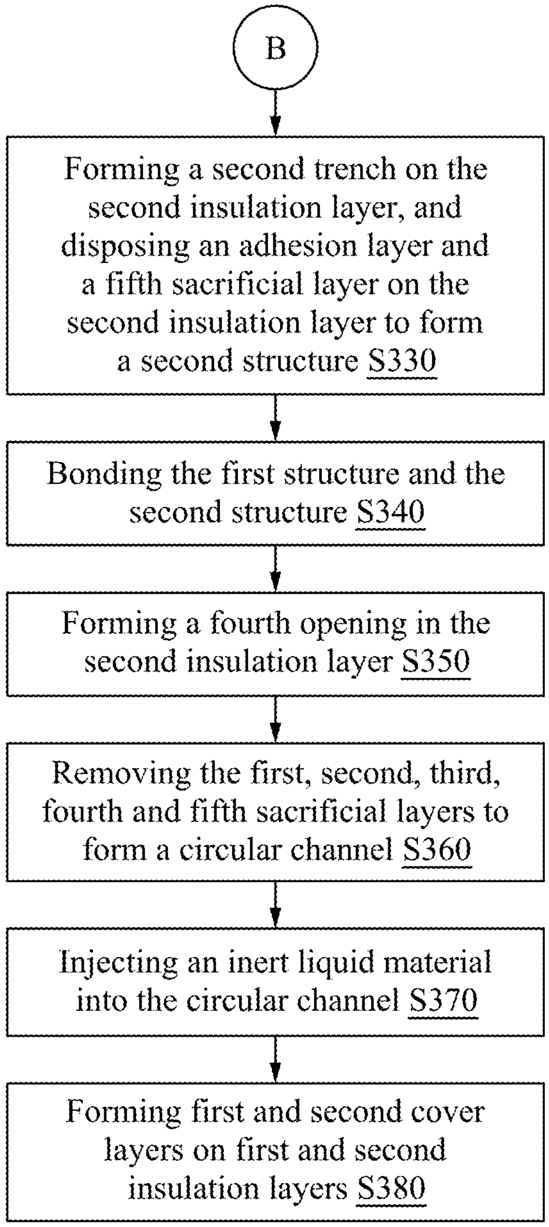
Figure 4A:
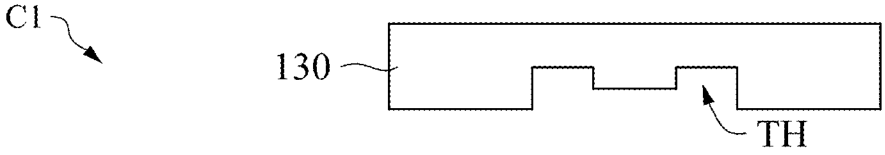
FIGS. 4A through 4U are cross-sectional views of a circuit board having a switch at various stages of process in accordance with one example of the present disclosure.
Figure 4B:
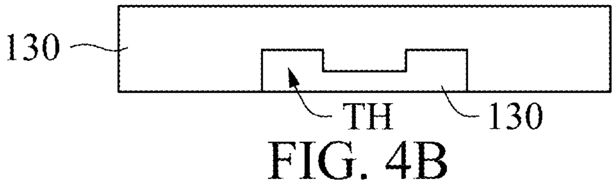
Figure 4C:
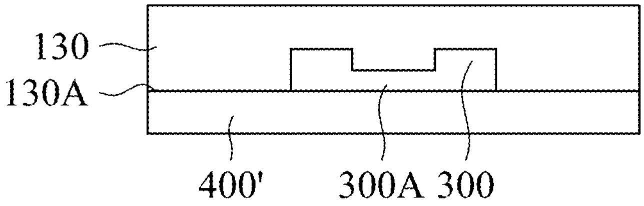
Figure 4D:
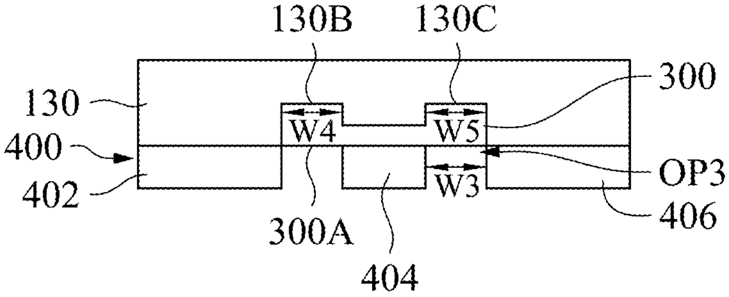
Figure 4E:
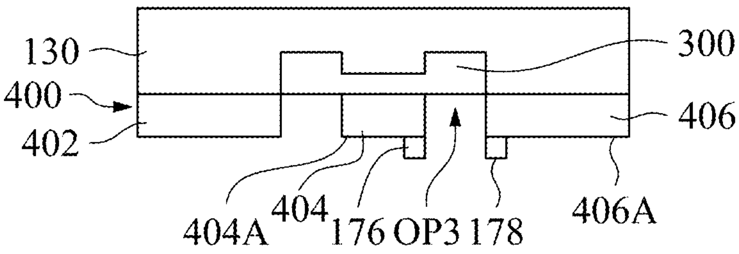
Figure 4F:
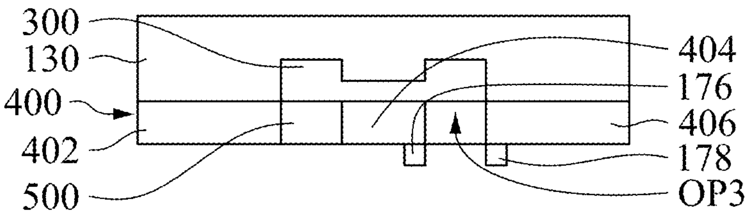
Figure 4G:
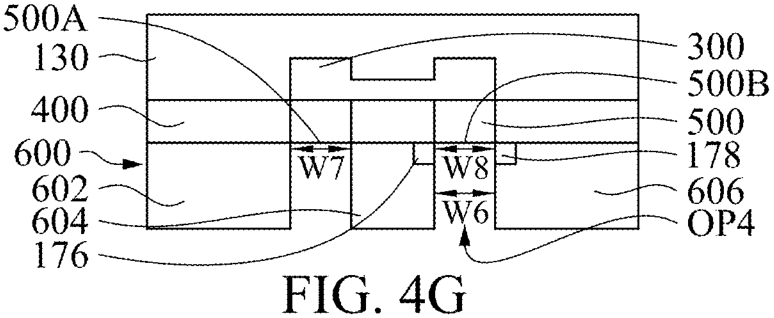
Figure 4H:
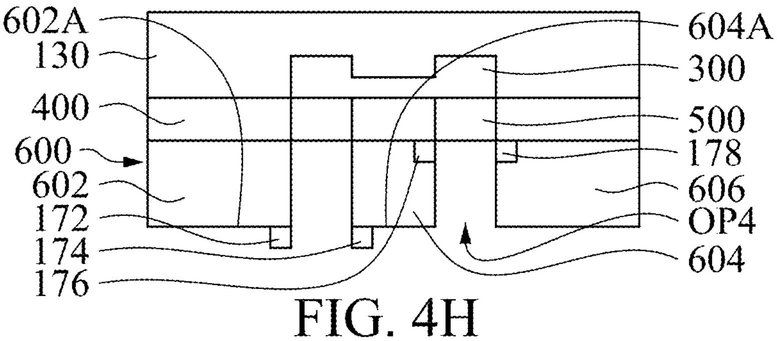
Figure 4I:
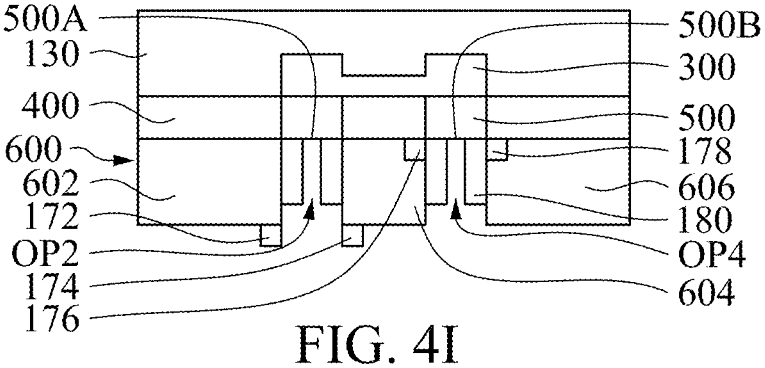
Figure 4J:
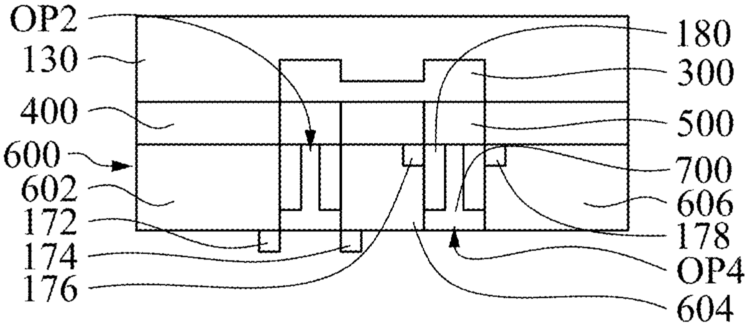
Figure 4K:
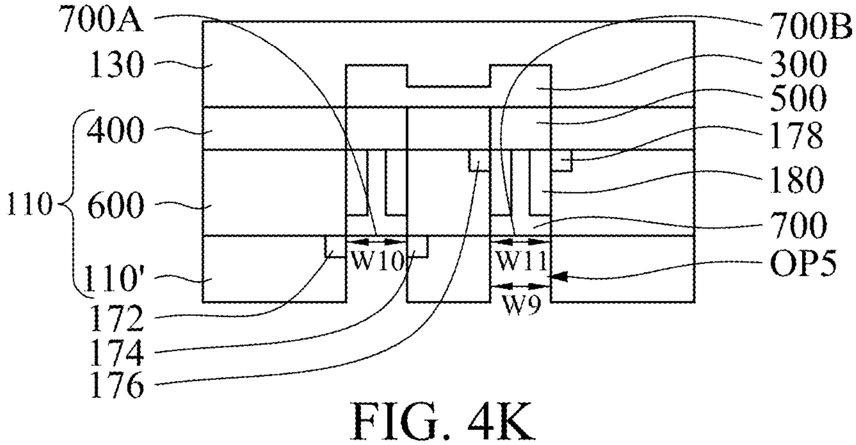
Figure 4L:
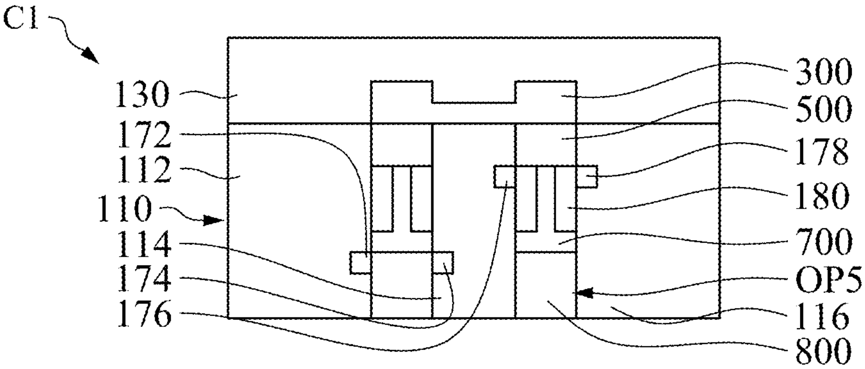
Figure 4M:
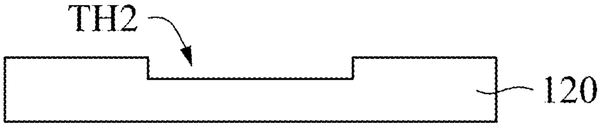
Figure 4N:
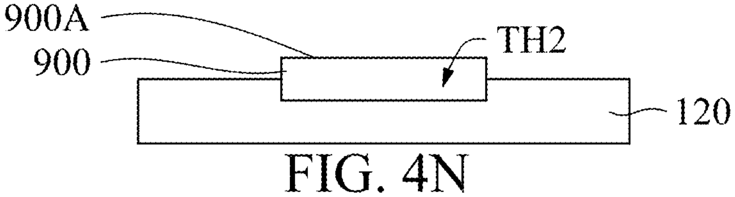
Figure 4O:
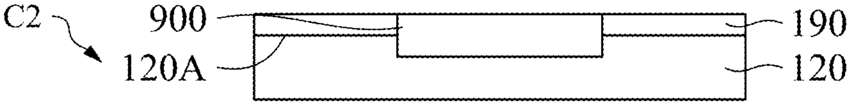
Figure 4P:
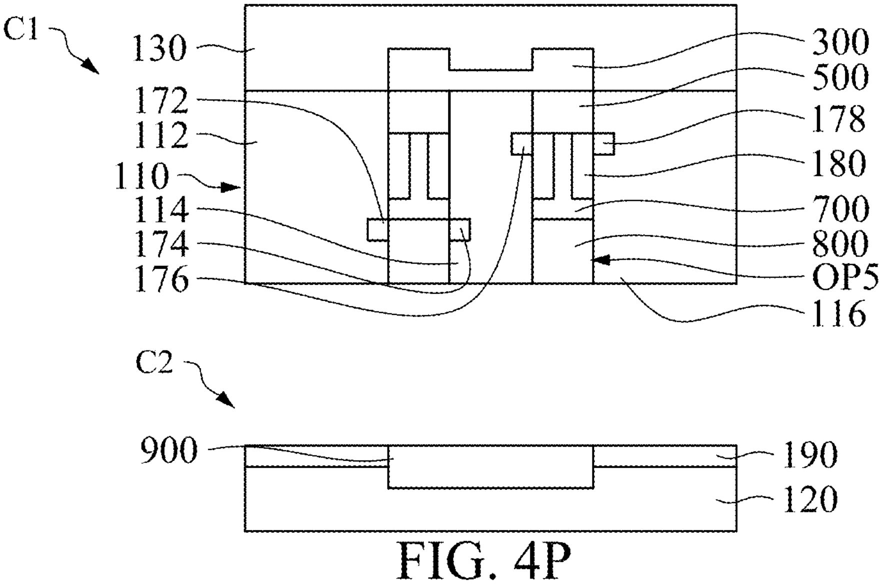
Figure 4Q:
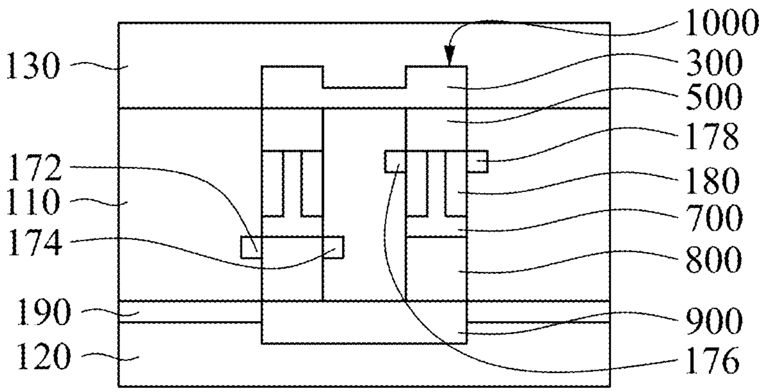
Figure 4R:
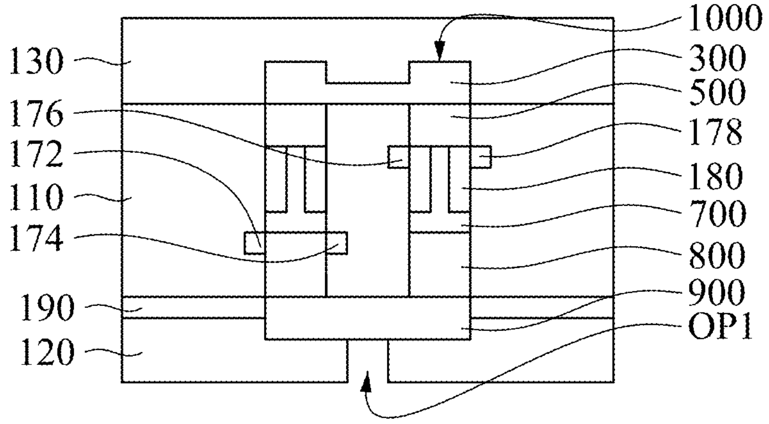
Figure 4S:
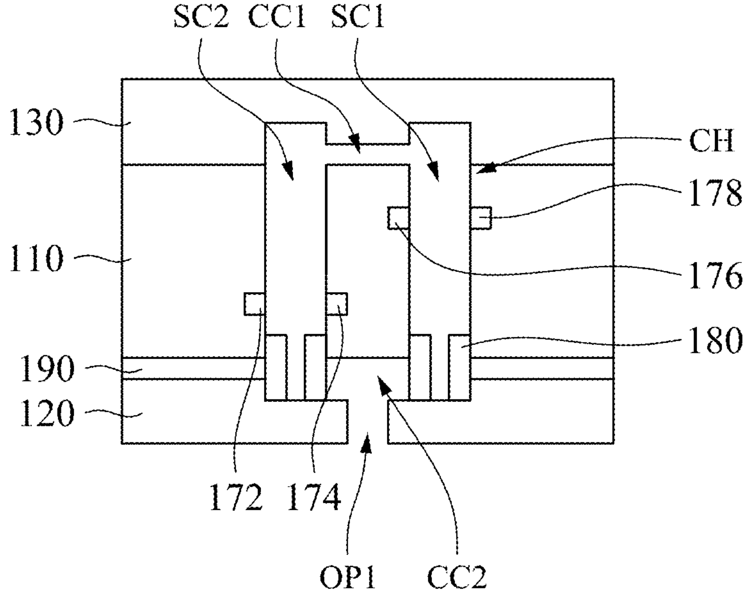
Figure 4T:
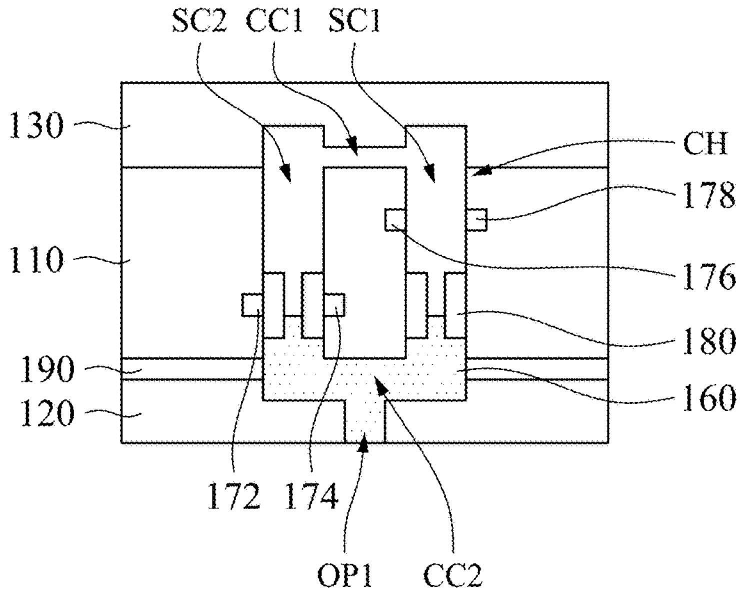
Figure 4U:
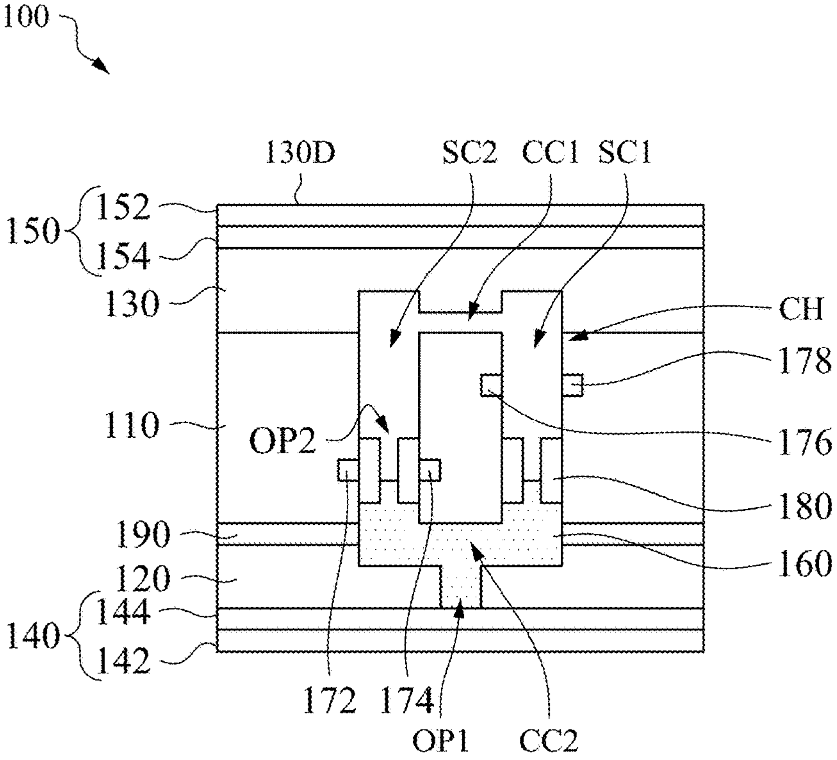

FIGS. 3A and 3B are a flow chart of a method for fabricating a circuit board 100 having a switch in accordance with some embodiments of the present disclosure. FIGS. 4A through 4U are cross-sectional views of a circuit board 100 having a switch at various stages of process in accordance with one example of the present disclosure. The illustration is merely exemplary and is not intended to limit beyond what is specifically recited in the claims that follow. The method 200 includes steps S210~S380. It should be understood that additional steps may be provided before, during and after steps S210~S380, and that some of the steps described below may be replaced or eliminated for another embodiment of the method. The order of steps/programs can be interchangeable.

First, refer to the FIGS. 3A and 4A. The method 200 proceeds to step S210. The insulation layer 130 is patterned to form a trench TH. For example, in the present embodiment, a laser process is performed to the insulation layer 130 to form the trench TH. The trench TH makes the insulation layer 130 have the protruding portion 130P, and makes the surfaces 130B and 130C of the insulation layer 130 higher than the surface 130A.

Subsequently, refer to the FIGS. 3A and 4B. The method 200 proceeds to step S220. A sacrificial layer 300 is formed in the trench TH. For example, in the present embodiment, the sacrificial layer 300 may be formed in the trench TH by a printing process, and fills the formed in the trench TH. In some embodiments, the printing process includes a spin coating process, an inkjet printing process, a flexography process, a plate printing process, printing processes similar thereto or combination thereof.

Subsequently, refer to the FIGS. 3A and 4C. The method 200 proceeds to step S230. An insulation material layer 400' is formed on the sacrificial layer 300. For example, in the present embodiment, the insulation material layer 400' may be formed on a surface 300A of the sacrificial layer 300 and the surface 130A of the insulation layer 130 by a printing process. The insulation material layer 400' may be a photosensitive insulation layer, such as a photosensitive polyimide.

Subsequently, refer to the FIGS. 3A and 4D. The method 200 proceeds to step S240. The insulation material layer 400' is patterned to form an opening OP3. For example, in the present embodiment, an image transfer process is performed to the insulation material layer 400' to form an insulation material layer 400. The insulation material layer 400 has the opening OP3 to expose part of the surface 300A of the sacrificial layer 300, and the opening OP3 separates portions 402, 404 and 406 of the insulation material layer 400. A width W3 of the opening OP3 is the same as a width W4 of the surface 130B of the insulation layer 130 and a width W5 of the surface 130C of the insulation layer 130. In addition, in some embodiments, the image transfer process includes a photolithography process, in which the photolithography process includes an exposure, developing, baking, steps similar thereto or combined steps thereof.

Subsequently, refer to the FIGS. 3A and 4E. The method 200 proceeds to step S250. The contact points 176 and 178 are disposed adjacent to the opening OP3. For example, in the present embodiment, the contact points 176 and 178 are formed on a surface 404A of the portion 404 and a surface 406A of the portion 406 of the insulation material layer 400 by a printing process, and are adjacent to the opening OP3.

Subsequently, refer to the FIGS. 3A and 4F. The method 200 proceeds to step S260. A sacrificial layer 500 is formed in the opening OP3. For example, in the present embodiment, the sacrificial layer 500 is formed in the opening OP3 by a printing process, and is in contact with the sacrificial layer 300.

Subsequently, refer to the FIGS. 3A and 4G. The method 200 proceeds to step S270. An insulation material layer 600 is formed on the insulation material layer 400, and the insulation material layer 600 is patterned to form an opening OP4. For example, in the present embodiment, the insulation material layer 600 is formed on the insulation material layer 400 and the sacrificial layer 500 by a printing process, and surrounds the contact points 176 and 178. Subsequently, the image transfer process is performed to the insulation material layer 600 to forming the opening OP4. The opening OP4 exposes surfaces 500A and 500B of the sacrificial layer 500, a side surface of the contact point 176 and a side surface of the contact point 178, and the opening OP4 separates portions 602, 604 and 606 of the insulation material layer 600, in which a width W6 of the opening OP4 is the same as a width W7 of the surface 500A of the sacrificial layer 500 and a width W8 of the surface 500B of the sacrificial layer 500.

Subsequently, refer to the FIGS. 3A and 4H. The method 200 proceeds to step S280. The contact points 172 and 174 are disposed adjacent to the opening OP4. For example, in the present embodiment, the contact points 172 and 174 are formed on a surface 602A of the portion 602 and a surface 604A of the portion 604 of the insulation material layer 600 by a printing process.

Subsequently, refer to the FIGS. 3A and 4I. The method 200 proceeds to step S290. The conductive block 180 is disposed in the opening OP4. The conductive block 180 is in contact with surfaces 500A and 500B of the sacrificial layer 500.

Subsequently, refer to the FIGS. 3A and 4J. The method 200 proceeds to step S300. A sacrificial layer 700 is formed in the opening OP4. For example, in the present embodiment, the sacrificial layer 700 is formed in openings OP2 and OP4 by a printing process, and is in contact with the sacrificial layer 500.

Subsequently, refer to the FIGS. 3A and 4K. The method 200 proceeds to step S310. An insulation material layer 110' is formed on insulation material layers 400 and 600, and the insulation material layer 110' is patterned to form an opening OP5. For example, in the present embodiment, the insulation material layer 110' is formed on the insulation material layer 600 and the sacrificial layer 700, and surrounds contact points 172 and 174. Subsequently, the image transfer process is performed to the insulation material layer 600 to forming the opening OP5, in which the insulation material layer 110' and the insulation material layer 600 are collectively referred to as the insulation material layer 110. The opening OP5 exposes surfaces 700A and 700B of the sacrificial layer 700, a side surface of the contact point 172 and a side surface of the contact point 174, in which a width W9 of the opening OP5 is the same as a width W10 of the surface 700A of the sacrificial layer 700 and a width W11 of the surface 700B of the sacrificial layer 700.

Subsequently, refer to the FIGS. 3A and 4L. The method 200 proceeds to step S320. A sacrificial layer 800 is formed in the opening OP5 to form a structure C1. For example, in the present embodiment, the sacrificial layer 800 is formed in the opening OP5 by a printing process, and is in contact with the sacrificial layer 700.

Subsequently, refer to the FIGS. 3A and 4M. The method 200 proceeds to step S330. A trench TH2 is formed on the insulation layer 120, and the adhesion layer 190 is disposed on the insulation layer 120 to form a structure C2. For example, in the present embodiment, a laser process is performed to the insulation layer 120 to form the trench TH2. Subsequently, refer to FIG. 4N. A sacrificial layer 900 is formed in the trench TH2, and fills the trench TH2, in which a surface 900A of the sacrificial layer 900 is higher than the surface 120A of the insulation layer 120. Subsequently, refer to FIG. 4O. The adhesion layer 190 is formed on the surface 120A of the insulation layer 120 by a printing process.

Subsequently, refer to the FIGS. 3B, 4P and 4Q. The method 200 proceeds to step S340. Structures C1 and C2 are boned. For example, in some embodiments, a lamination method is performed to structures C1 and C2, so that the adhesion layer 190 is in contact with the insulation material layer 110, thus bonding the structures C1 and C2, and the sacrificial layer 900 is in contact with sacrificial layers 300, 500, 700 and 800 to form a sacrificial layer 1000.

Subsequently, refer to the FIGS. 3B and 4R. The method 200 proceeds to step S350. The opening OP1 is formed in the insulation layer 120. For example, in the present embodiment, a laser process is performed to the insulation layer 120 to form the opening OP1.

Subsequently, refer to the FIGS. 3B and 4S. The method 200 proceeds to step S360. The sacrificial layer 1000 is removed to form the circular channel CH. For example, in the present embodiment, the sacrificial layer 1000 is removed by an etching process, a heating process, processes similar thereto or combinations thereof to form the circular channel CH, the sub-channel SC1, the sub-channel SC2, the connection channel CC1 and the connection channel CC2.

Subsequently, refer to the FIGS. 3B and 4T. The method 200 proceeds to step S370. The inert liquid material 160 is injected into the circular channel CH through the opening OP1. Subsequently, refer to the FIGS. 3B and 4U. The method 200 proceeds to step S380. Cover layers 140 and 150 are formed on insulation layers 120 and 130 to form the circuit board 100 having a switch. For example, in the present embodiment, cover layers 140 and 150 are formed on the surface 120D of the insulation layer 120 and the surface 130D of the insulation layer 130 by a lamination process.

In addition, in some embodiments, the method 200 further includes a step, in which the step may include an electroless nickel immersion gold (ENIG) process. For example, in some embodiments, the ENIG process may be performed to contact points 176 and 178 before or after the step S260 to reduce contact resistances of contact points 176 and 178. For example, in another embodiment, the ENIG process may be performed to contact points 172 and 174 before or after the step S280 to reduce contact resistances of contact points 172 and 174.

According to some embodiments of the present disclosure, a circuit board having a switch is provided. The switch may make a conductive block levitate in an inert liquid material by a density difference between the inert liquid material and the conductive block, so that the switch may control the circuit to turn on or turn off by utilizing changes of the positions or the gravitational directions of the object. By using the principle of the gravity rather than an electrical signal or a mechanical contact, operational mistakes caused by an abrasion, an electromagnetic interference and so on can be reduced. Since the switch generally works without electricity, it is beneficial to extend the working time of the apparatuses and the life time of the batteries. Furthermore, the switch may be applied to different environmental conditions. Whether in a high temperature, a low temperature or in other environments, the switch may maintain a stable working performance, increasing its application possibilities in extreme conditions. In summary, the switch may trigger a switch action according to changes of a tilting angle or a position of the devices, so that the switch may provide advantages of flexibility, reliability, ease of use, wide range of applications, low power consumption, and adaptability. Thus, the switch may be applied in different devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board having a switch, wherein the circuit board comprises:
- an insulation material layer;
- a first insulation layer on a bottom surface of the insulation material layer;
- a second insulation layer on a top surface of the insulation material layer;
- a circular channel in the first insulation layer, the insulation material layer and the second insulation layer, wherein the circular channel comprises:
  - a first sub-channel extending from the first insulation layer toward the second insulation layer;
  - a second sub-channel adjacent to the first sub-channel and extending from the first insulation layer toward the second insulation layer;
  - a first connection channel fluidly connecting a bottom end of the first sub-channel to a bottom end of the second sub-channel; and
  - a second connection channel fluidly connecting a top end of the first sub-channel to a top end of the second sub-channel;
- a first cover layer on a bottom surface of the first insulation layer and configured to seal an opening of the first insulation layer;
- an inert liquid material in the circular channel;
- a first conductive block in the first sub-channel, wherein a density of the inert liquid material is greater than a density of the first conductive block;
- a second conductive block in the second sub-channel, wherein a density of the inert liquid material is greater than a density of the second conductive block; and
- a conductive layer in the insulation material layer and adjacent to the circular channel.

2. The circuit board of claim 1, wherein the first connection channel is fluidly connected to the opening of the first insulation layer.

3. The circuit board of claim 1, further comprising:
- a second cover layer on a top surface of the second insulation layer.

4. The circuit board of claim 1, wherein the first conductive block is in direct contact with the insulation material layer and the inert liquid material.

5. The circuit board of claim 1, wherein the first conductive block has a conductive block opening, and the conductive block opening extends from a top surface of the first conductive block to a bottom surface of the first conductive block.

6. The circuit board of claim 1, wherein the first conductive block has a same width as a width of the first sub-channel of the circular channel.

7. The circuit board of claim 1, wherein the density of the inert liquid material is between 4.3 $g/cm^3$ and 2.75 $g/cm^3$.

8. The circuit board of claim 1, wherein the density of the first conductive block is between 2 $g/cm^3$ and 2.3 $g/cm^3$.

9. A method for fabricating a circuit board having a switch, comprising:
- forming a first structure, comprising:
  - forming a circular channel in a first insulation layer and an insulation material layer, wherein the first insulation layer is on a top surface of the insulation material layer;
  - disposing a conductive layer in the insulation material layer and adjacent to the circular channel; and
  - disposing a conductive block in the circular channel, wherein the conductive block has a conductive block opening, and the conductive block opening extends from a top surface of the conductive block to a bottom surface of the conductive block;
- forming a second structure, wherein the second structure has a second insulation layer;
- bonding the first structure and the second structure to seal the circular channel;
- forming a first opening in the second insulation layer;
- injecting an inert liquid material into the circular channel through the first opening, wherein a density of the inert liquid material is greater than a density of the conductive block; and
- forming a cover layer on a bottom surface of the second insulation layer to seal the first opening of the second insulation layer.

10. The method of claim 9, wherein forming the first structure further comprises:
- forming a sacrificial layer in the circular channel before or after disposing the conductive block, and the method further comprises:
  - removing the sacrificial layer from the circular channel before injecting the inert liquid material and after forming the first opening.

11. The method of claim 9, wherein forming the circular channel is performed such that the circular channel comprises a first sub-channel and a second sub-channel, and the first and second sub-channels extend in the same direction.

12. The method of claim 11, wherein a width of the second sub-channel is the same as a width of the first sub-channel.

13. The method of claim 11, wherein forming the circular channel is performed such that the circular channel further comprises a first connection channel and a second connection channel, wherein the first connection channel fluidly connects a bottom end of the first sub-channel to a bottom end of the second sub-channel, and the second connection channel fluidly connects a top end of the first sub-channel to a top end of the second sub-channel.

14. The method of claim 13, wherein a length of the first opening is less than a length of the first connection channel.

15. The method of claim 13, wherein a width of the second connection channel is less than a width of the first connection channel.

* * * * *